(12) United States Patent
Tsai et al.

(10) Patent No.: US 11,569,130 B2
(45) Date of Patent: Jan. 31, 2023

(54) FIN FIELD EFFECT TRANSISTOR (FINFET) DEVICE STRUCTURE WITH DUMMY FIN STRUCTURE

(71) Applicant: TAIWAN SEMICONDUCTOR MANUFACTURING COMPANY, LTD., Hsinchu (TW)

(72) Inventors: Tzung-Yi Tsai, Taoyuan (TW); Yen-Ming Chen, Chupei (TW); Tsung-Lin Lee, Hsinchu (TW); Chih-Chieh Yeh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 5 days.

(21) Appl. No.: 17/031,023

(22) Filed: Sep. 24, 2020

(65) Prior Publication Data
US 2021/0020517 A1 Jan. 21, 2021

Related U.S. Application Data

(60) Continuation of application No. 16/730,320, filed on Dec. 30, 2019, now Pat. No. 10,811,318, which is a
(Continued)

(51) Int. Cl.
*H01L 21/8234* (2006.01)
*H01L 27/088* (2006.01)

(52) U.S. Cl.
CPC ........ *H01L 21/823431* (2013.01); *H01L 21/823462* (2013.01); *H01L 21/823481* (2013.01); *H01L 27/0886* (2013.01)

(58) Field of Classification Search
CPC ..... H01L 21/823431; H01L 21/823821; H01L 21/845; H01L 29/66795–66818; H01L 29/41791; H01L 29/785–786; H01L 2029/7857–7858; H01L 27/0886; H01L 27/0924; H01L 27/10826; H01L 27/10879; H01L 27/1211; H01L 21/762;
(Continued)

(56) References Cited

U.S. PATENT DOCUMENTS 8,658,536 B1   2/2014  Choi et al.
9,899,267 B1   2/2018  Liou et al.
(Continued)

FOREIGN PATENT DOCUMENTS

TW   201517274 A   5/2015
TW   201628129 A   8/2018

*Primary Examiner* — Sonya McCall-Shepard
(74) *Attorney, Agent, or Firm* — Birch, Stewart, Kolasch & Birch, LLP

(57) ABSTRACT

A fin field effect transistor (FinFET) device structure with dummy fin structures and method for forming the same are provided. The FinFET device structure includes an isolation structure over a substrate, and a first fin structure extended above the isolation structure. The fin field effect transistor (FinFET) device structure includes a second fin structure adjacent to the first fin structure, and a material layer formed over the fin structure. The material layer and the isolation structure are made of different materials, the material layer has a top surface with a top width and a bottom surface with a bottom width, and the bottom width is greater than the top width.

20 Claims, 16 Drawing Sheets

Related U.S. Application Data division of application No. 15/692,768, filed on Aug. 31, 2017, now Pat. No. 10,522,409.

(58) Field of Classification Search
CPC ............. H01L 21/76224; H01L 21/764; H01L 21/823481; H01L 21/823462
See application file for complete search history.

(56) References Cited

U.S. PATENT DOCUMENTS

| | | |
|---|---|---|
| 10,446,663 B2 * | 10/2019 | Yin ..................... H01L 29/4238 |
| 2007/0218645 A1 | 9/2007 | Zhou |
| 2015/0243739 A1 | 8/2015 | Chen et al. |
| 2016/0329329 A1 | 11/2016 | Chen et al. |
| 2016/0351565 A1 | 12/2016 | Sung et al. |
| 2016/0359012 A1 * | 12/2016 | Yu ......................... H01L 23/485 |
| 2017/0317084 A1 | 11/2017 | Cantoro et al. |
| 2018/0096895 A1 * | 4/2018 | Sung ................ H01L 29/66795 |
| 2018/0323192 A1 * | 11/2018 | Li ..................... H01L 21/76229 |

* cited by examiner

FIN FIELD EFFECT TRANSISTOR (FINFET) DEVICE STRUCTURE WITH DUMMY FIN STRUCTURE

CROSS REFERENCE TO RELATED APPLICATIONS

This application is a Continuation application of U.S. patent application Ser. No. 16/730,320, filed on Dec. 30, 2019, which is a Divisional application of U.S. patent application Ser. No. 15/692,768, filed on Aug. 31, 2017 (now U.S. Pat. No. 10,522,409 issued on Dec. 31, 2019), the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and higher current flow.

Although existing FinFET devices and methods of fabricating FinFET devices have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
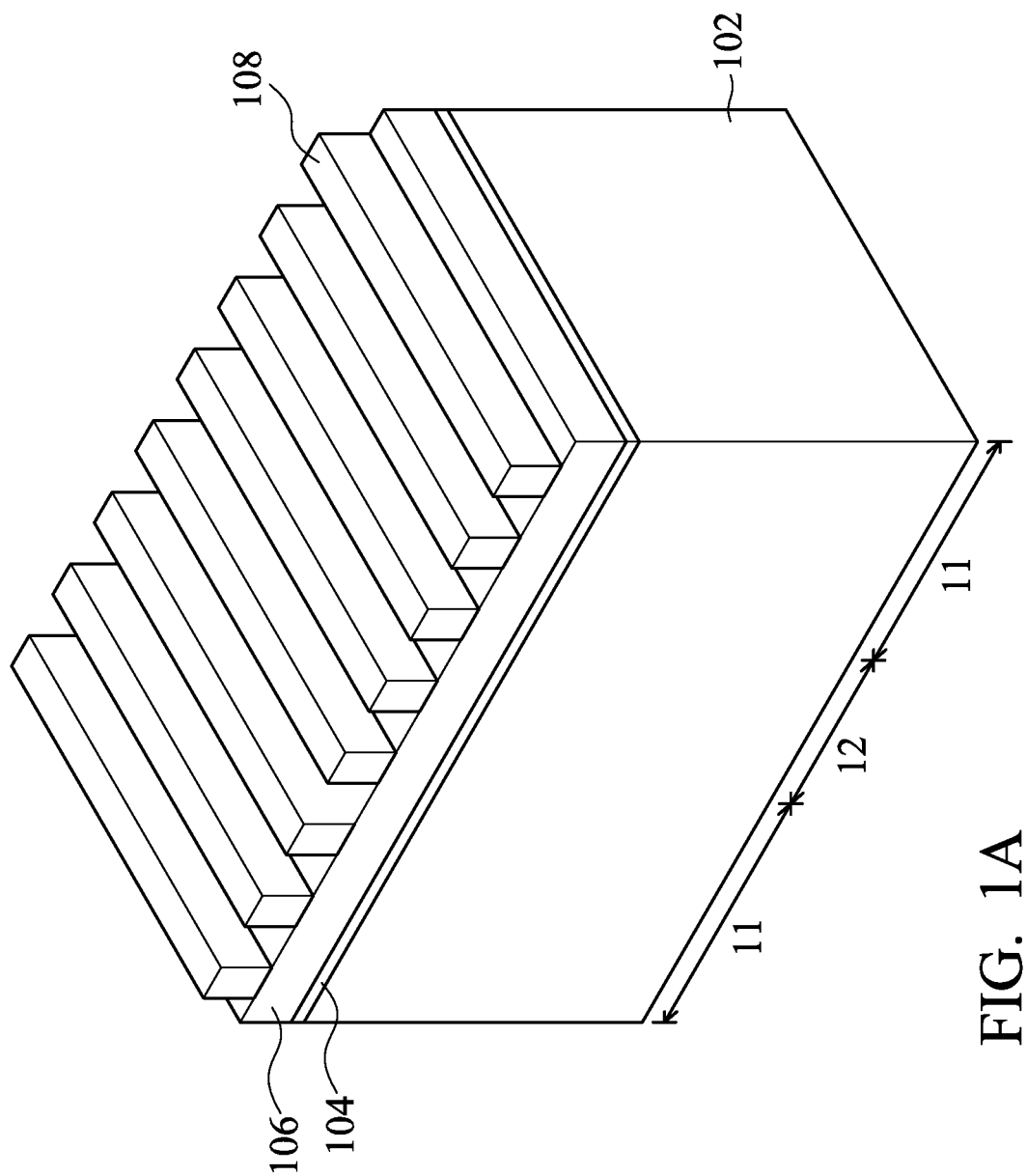
FIGS. 1A-1E show three-dimensional representations of forming a fin field effect transistor (FinFET) device structure, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments for forming a fin field effect transistor (FinFET) device structure are provided. FIGS. 1A-1E show three-dimensional representations of forming a fin field effect transistor (FinFET) device structure, in accordance with some embodiments of the disclosure.

As shown in FIG. 1A, the FinFET device structure includes a substrate 102. The substrate 102 includes a first region 11 and a second region 12. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

In some embodiments, a well portion (not shown) may be formed on the substrate 102 in the first region 11 or the second region 12. An ion implantation process is performed on the substrate 102 form the well portion. In some embodiments, the well portion may be doped with arsenic (As) or phosphorous (P) ions to form the N-well portion. In some embodiments, the well portion is doped with boron (B) ions to form the P-well portion.

Afterwards, a dielectric layer 104 and a mask layer 106 are formed over the substrate 102, and a photoresist layer 108 is formed over the mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

The dielectric layer 104 is a buffer layer between the substrate 102 and the mask layer 106. In addition, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 are formed by deposition processes, such as a chemical vapor deposition (CVD) process, a high-density plasma chemical vapor deposition (HDPCVD) process, a spin-on process, a sputtering process, or another applicable process.

Figure 1B:
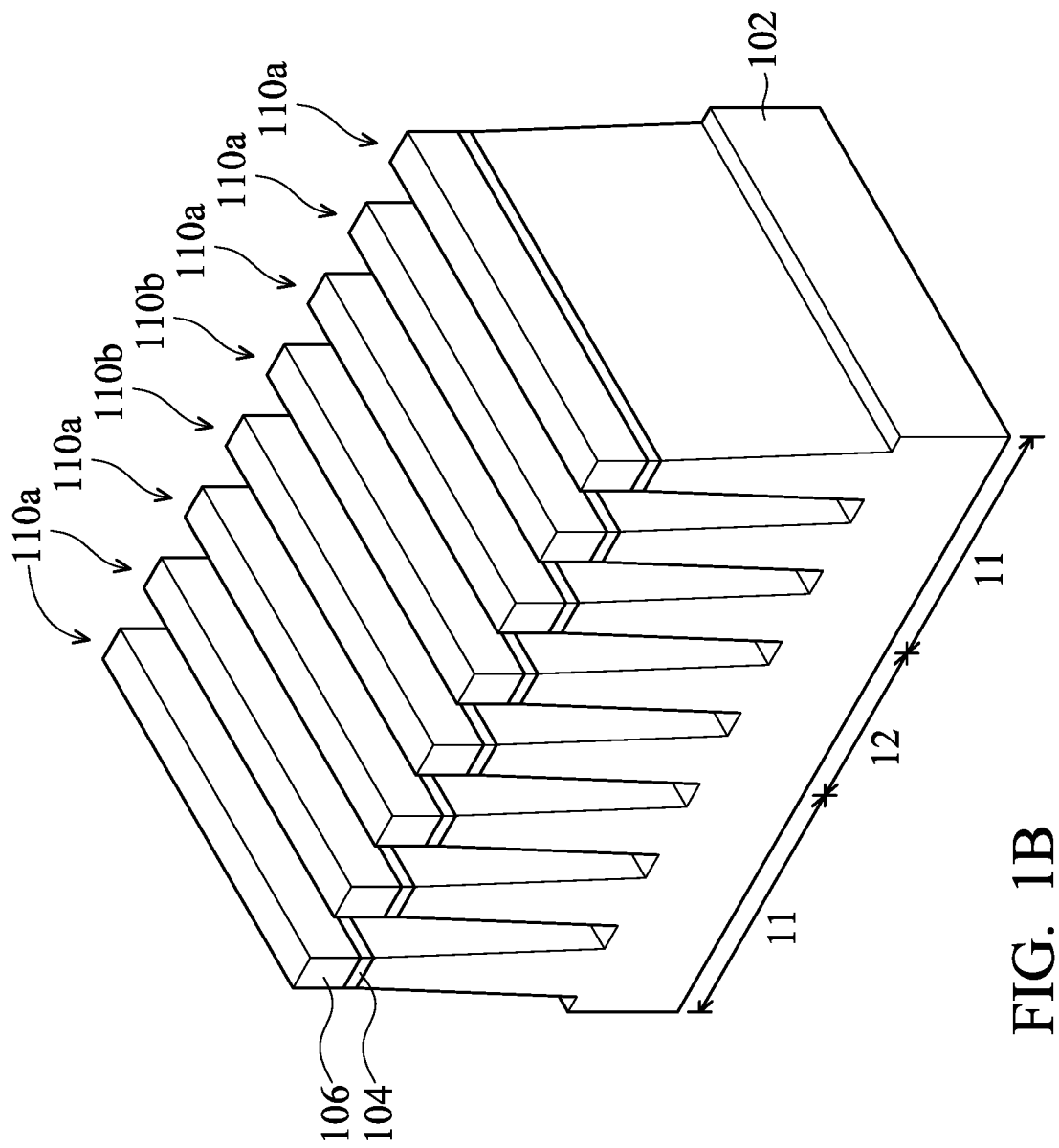

Afterwards, as shown in FIG. 1B, after the photoresist layer 108 is patterned, the dielectric layer 104 and the mask layer 106 are patterned by using the patterned photoresist layer 108 as a mask, in accordance with some embodiments. As a result, a patterned dielectric layer 104 and a patterned mask layer 106 are obtained. Afterwards, the patterned photoresist layer 108 is removed.

Afterwards, an etching process is performed on the substrate 102 to form a number of first fin structures 110a, and a number of second fin structures 110b by using the patterned dielectric layer 104 and the patterned mask layer 106 as a mask. The first fin structures 110a are formed in the first region 11. The second fin structures 110b are formed in the second region 12.

In some embodiments, each of the first fin structures 110a and each of the second fin structures 110b has a width that gradually increases from the top portion to the bottom portion. In other words, each of the first fin structures 110a and each of the second fin structures 110b has a tapered fin width which tapers gradually from the bottom portion to the top portion.

The etching process may be a dry etching process or a wet etching process. In some embodiments, the substrate 102 is etched using a dry etching process. The dry etching process includes using a fluorine-based etchant gas, such as $SF_6$, $C_xF_y$, $NF_3$ or a combination thereof. The etching process may be a time-controlled process, and continue until the first fin structures 110a and the second fin structures 110b reach a predetermined height.

Figure 1C:
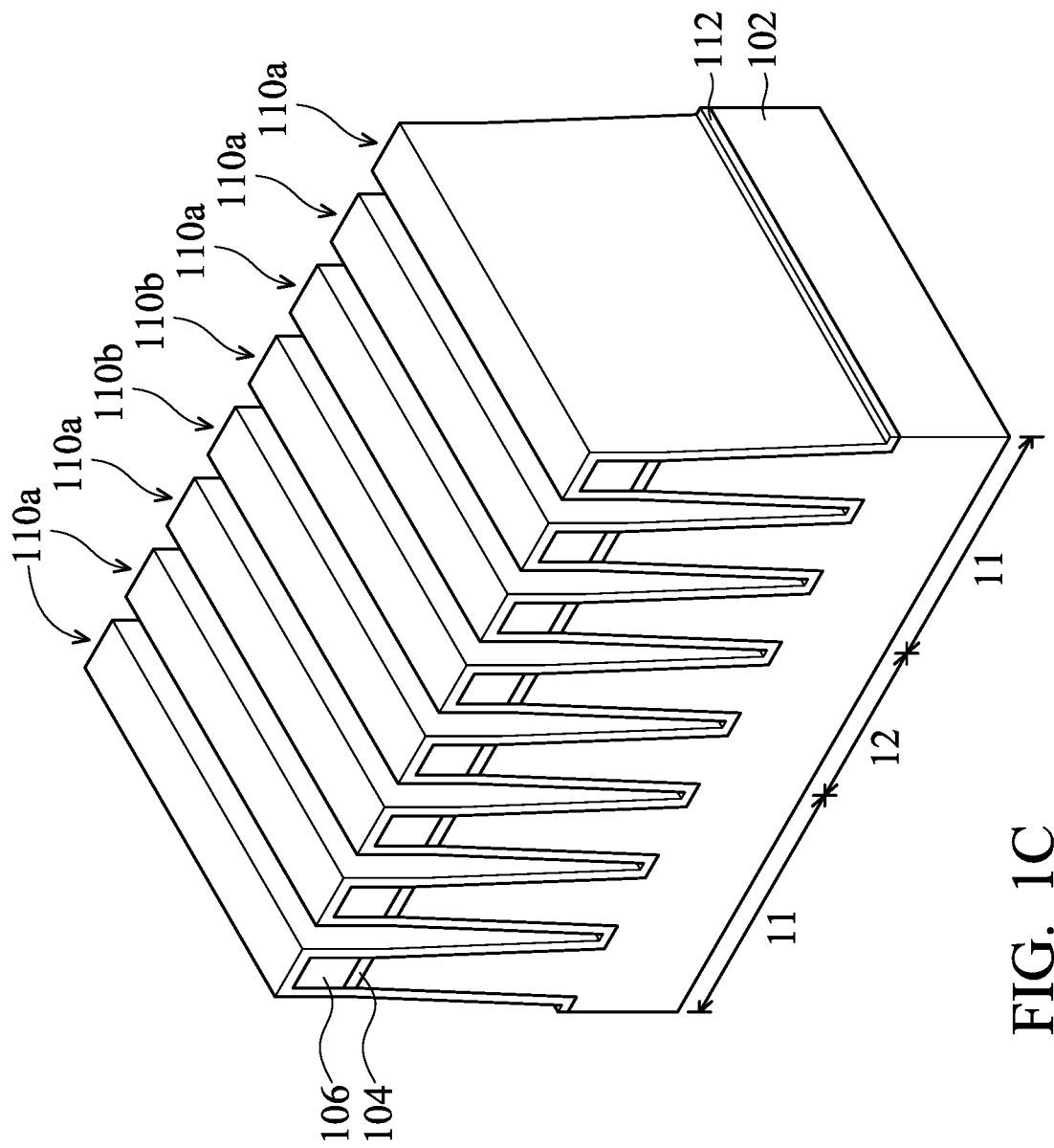

As shown in FIG. 1C, after the first fin structures 110a and the second fin structures 110b are formed, a liner layer 112 is formed on the first fin structures 110a and the second fin structures 110b. More specifically, the liner layer 112 is conformally formed on the sidewall surfaces, top surface of the first fin structures 110a, the second fin structures 110b and on the mask layer 106.

The liner layer 112 is used to protect the first fin structures 110a, the second fin structures 110b from being damaged by the following processes (such as an anneal process or an etching process). Therefore, the profiles or shapes of the first fin structures 110a and the second fin structures 110b are maintained or preserved by the protection of the liner layer 112. In some embodiments, the liner layer 112 has a thickness in a range from about 2 nm to about 5 nm.

In some embodiments, the liner layer 112 is made of silicon nitride ($SixNy$). In some embodiments, the liner layer 112 is not made of oxide, such as silicon oxide. If the liner layer 112 made of silicon oxide, the liner layer 112 is not robust enough to protect the first fin structures 110a and the second fin structures 110b, especially when the first fin structures 110a, the second fin structures 110b, include silicon germanium (SiGe).

Figure 1D:
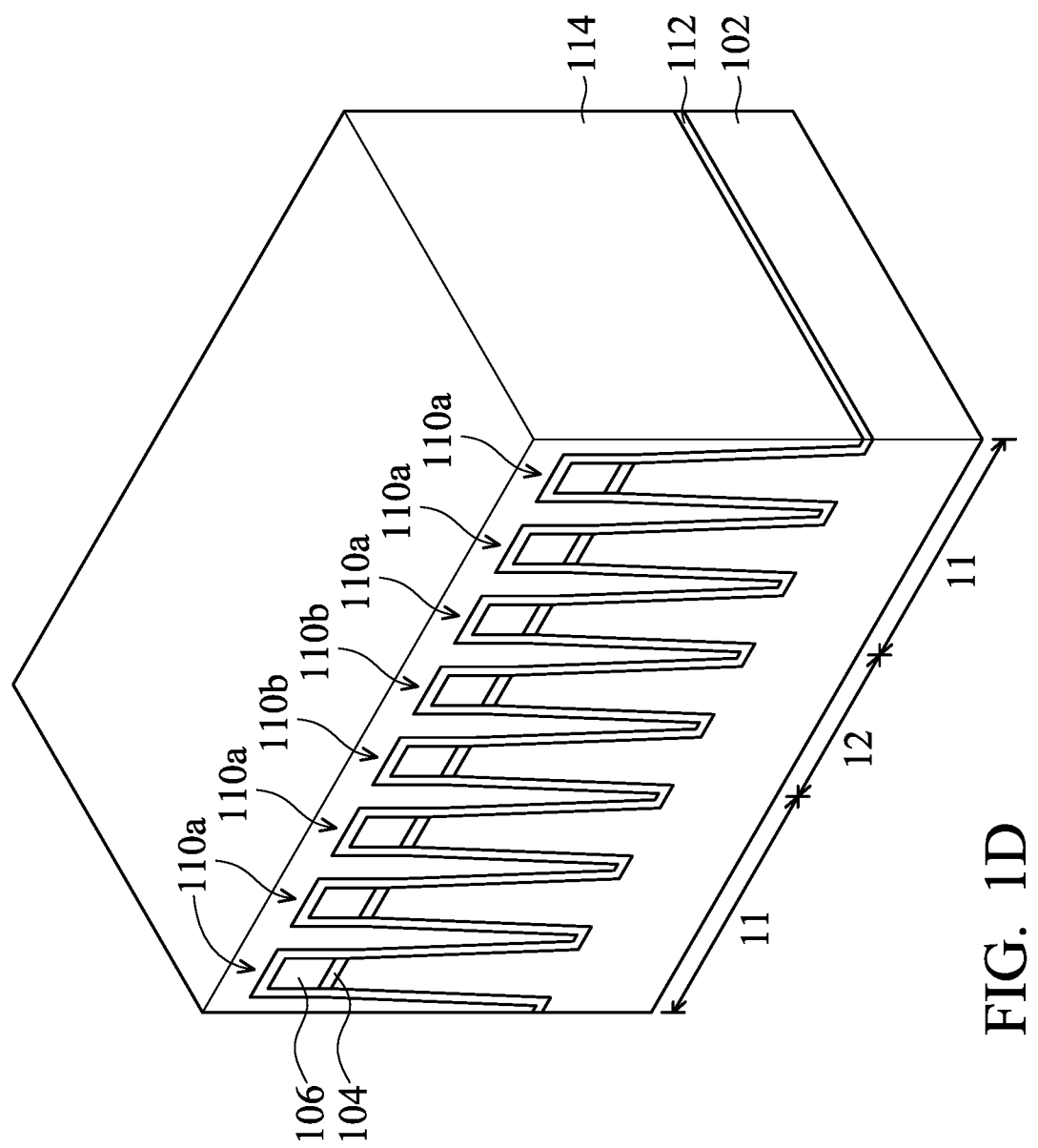

Afterwards, as shown in FIG. 1D, an isolation layer 114 is formed to cover the first fin structures 110a and the second fin structures 110b over the substrate 102, in accordance with some embodiments.

In some embodiments, the isolation layer 114 is made of silicon oxide, silicon nitride, silicon oxynitride, fluoride-doped silicate glass (FSG), or another low-k dielectric material. The isolation layer 114 may be deposited by a deposition process, such as a chemical vapor deposition (CVD) process, a spin-on-glass process, or another applicable process.

In some embodiments, the isolation layer 114 is formed by a flowable chemical vapor deposition (FCVD) process. The isolation layer 114 is solidified by a UV curing process. Afterwards, an annealing process is performed on the isolation layer 114 to improve the quality of the isolation layer 114. In some embodiments, the annealing process is performed at a temperature in a range from about 400 degrees to about 700 degrees. The patterned mask layer 106 and the liner layer 112 both are used to protect the substrate 102 from being damaged during the annealing process, and therefore the profiles of the top portion of the first fin structures 110a and the second fin structures 110b are not damaged by the high temperature.

Figure 1E:
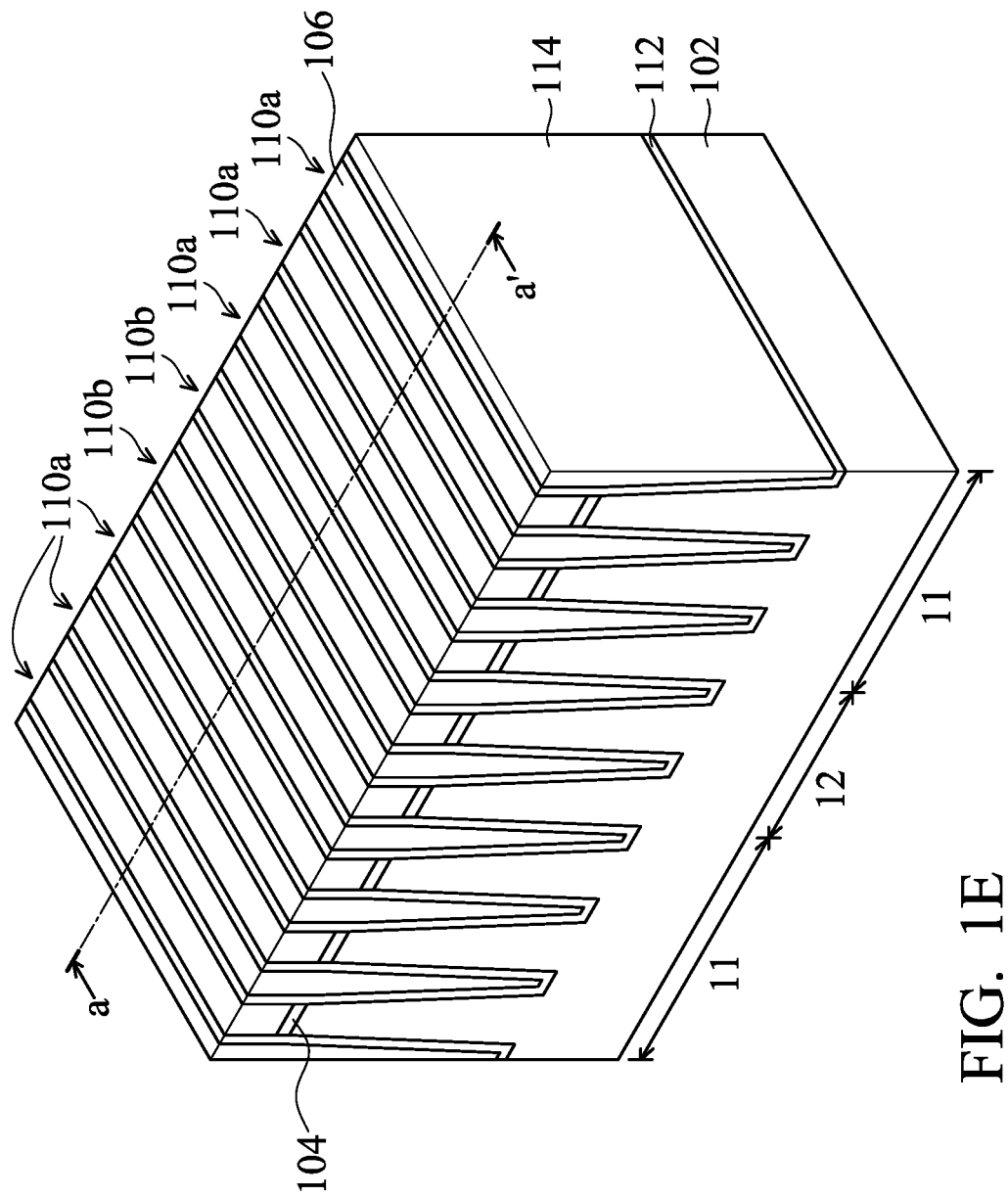

Next, as shown in FIG. 1E, the isolation layer 114 is thinned or planarized to expose the top surface of the patterned mask layer 106, in accordance with some embodiments. In some embodiments, the isolation layer 114 is thinned by a chemical mechanical polishing (CMP) process.

Figure 2A:
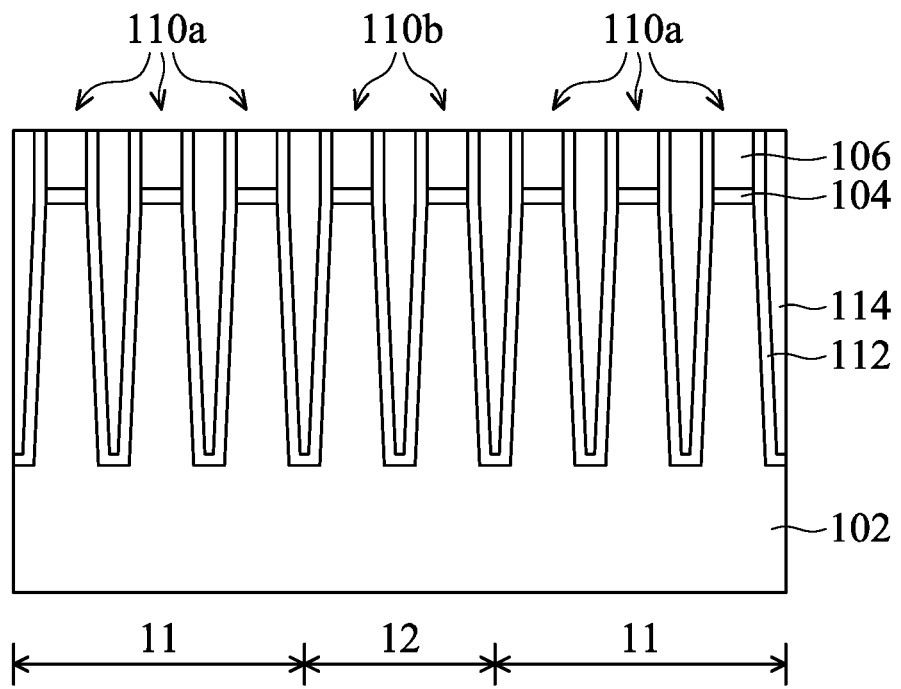
FIGS. 2A-2H show cross-sectional representations of forming a fin field effect transistor (FinFET) device structure, in accordance with some embodiments of the disclosure.

FIGS. 2A-2H show cross-sectional representations of forming a fin field effect transistor (FinFET) device structure, in accordance with some embodiments of the disclosure. FIG. 2A is cross-sectional representation taken along a-a' line of FIG. 1E. FIGS. 2B-2H show subsequent fabrication steps after the step of FIG. 1E.

As shown in FIG. 2A, after the planarizing process, the top surface of the patterned mask layer 106 is level with the top surface of the isolation layer 114.

Figure 2B:
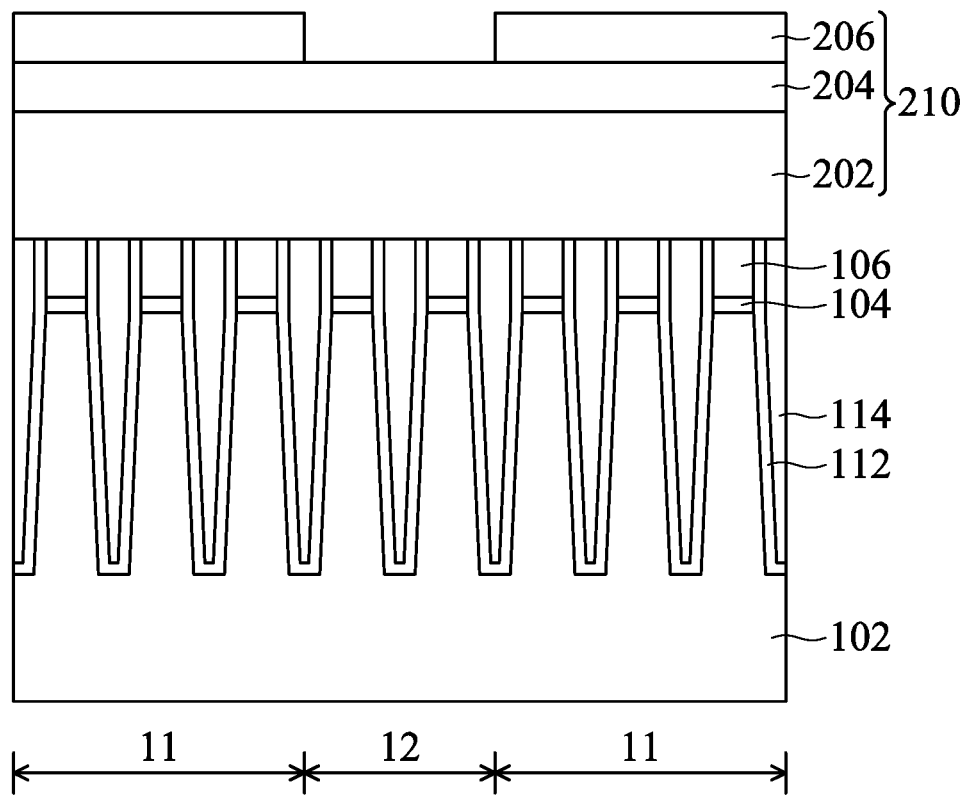

Afterwards, as shown in FIG. 2B, a photoresist layer 210 is formed over the patterned mask layer 106, the isolation layer 114 and the liner layer 112, in accordance with some embodiments of the disclosure. The photoresist layer 210 includes a bottom anti-reflective coating (BARC) layer 202, a middle layer 204 and a top layer 206. Afterwards, the top layer 206 is patterned to form a patterned top layer 206.

In some embodiments, the BARC layer 202 is made of silicon oxynitride (SiON), silicon rich oxide, or silicon oxycarbide (SiOC). In some embodiments, the middle layer 204 is made of silicon nitride, silicon oxynitride or silicon oxide. In some embodiments, the top layer 206 is made of Poly (methyl methacrylate) (PMMA), Poly (methyl glutarimide) (PMGI), Phenol formaldehyde resin (DNQ/Novolac) or SU-8.

Figure 2C:
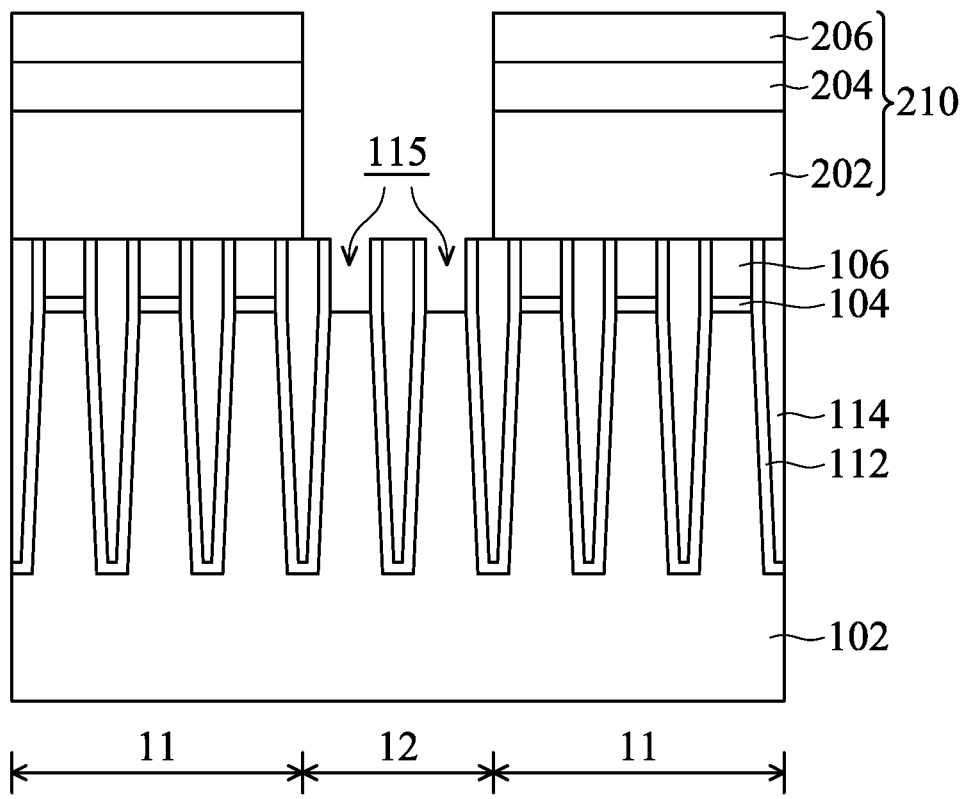

Next, as shown in FIG. 2C, the middle layer 204, the BARC layer 202 are patterned by using the patterned top layer 206 as the mask layer to form a patterned middle layer 204 and a patterned BARC layer 202, in accordance with some embodiments of the disclosure. A portion of the patterned mask layer 106 and a portion of the patterned dielectric layer 104 are removed to form a recess 115. The recess 115 is directly above the top surface of the second fin structures 110b in the second region 12. Afterwards, the patterned photoresist layer 210 is removed.

Figure 2D:
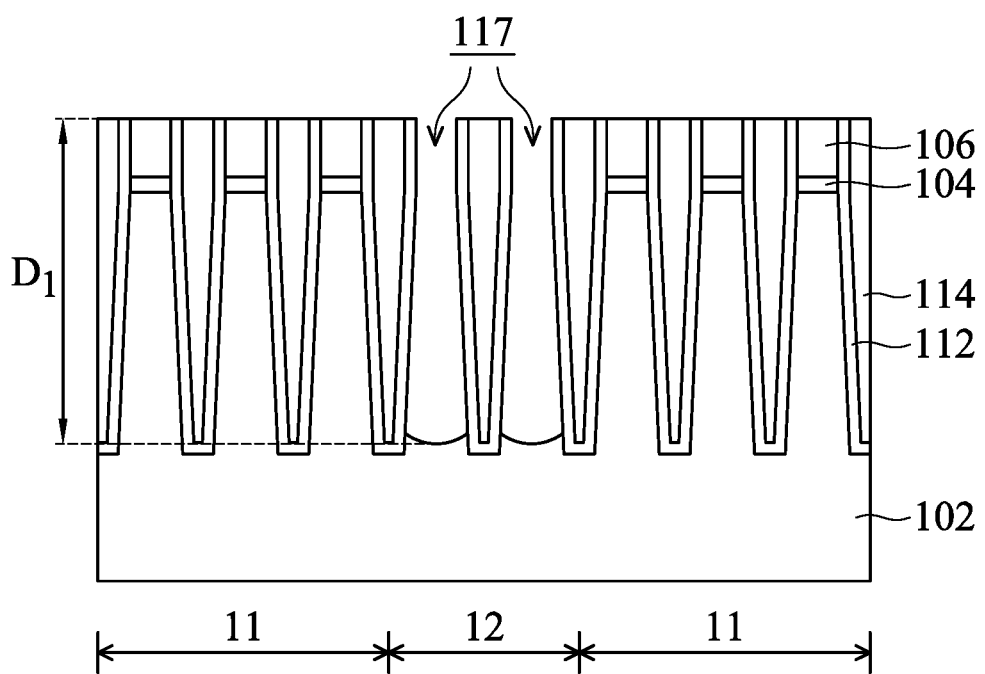

Afterwards, as shown in FIG. 2D, a portion of the second fin structures 110b is removed along the recess 115 to form a trench 117, in accordance with some embodiments of the disclosure. As a result, the second fin structures 110b in the second region 12 are lower than the first fin structures 110a in the first region 11. Since most of the second fin structures 110b is removed, the second fin structures 110b are called as dummy second fin structures 110b. The dummy second fin structures 110b do not perform any function.

The trench 117 has a tapered width from bottom to top. The bottom surface of the trench 117 has a concave surface, and the concave surface has a lowest point at the middle portion. The liner layer 112 is not removed and remaining on sidewalls of the trench 117.

When a portion of the second fin structures 110b is removed, the liner layer 112 and the patterned mask layer 106 are not removed since the liner layer 112 is made of a higher etching resistant material with respect to the second fin structures 110b.

The term of "selectivity" or "etching selectivity" is defined as the ratio of etching rate of one material (the reference material) relative to another material (the material of interest). An increase in etch selectivity means that the selected material, or material of interest, is harder to etch. A decrease in etch selectivity means that the selected material is easier to etch. The etching selectivity of the liner layer 112 with respect to the second fin structures 110b is high, and therefore the second fin structures 110b are removed by the etching process while the liner layer 112 is not removed.

The trench 117 has a depth $D_1$ which is measured from a top surface of the isolation layer 114 to a bottom surface of the trench 117. The lowest point of the trench 117 is lower than the top surface of the isolation structure 140 (shown in FIG. 2G). The trench 117 will be filled with a filling layer 118 (shown in FIG. 2G), and the dummy second fin structures 110b are covered by the filling layer 118. In some embodiments, the depth $D_1$ of the trench 117 is within a range from about 110 nm to about 120 nm. When the depth $D_1$ of the trench 117 is within the above-mentioned range, isolation effect is improved, and the S/D structure (formed later) will not be formed from the remaining second fin structures 110b.

Figure 2E:
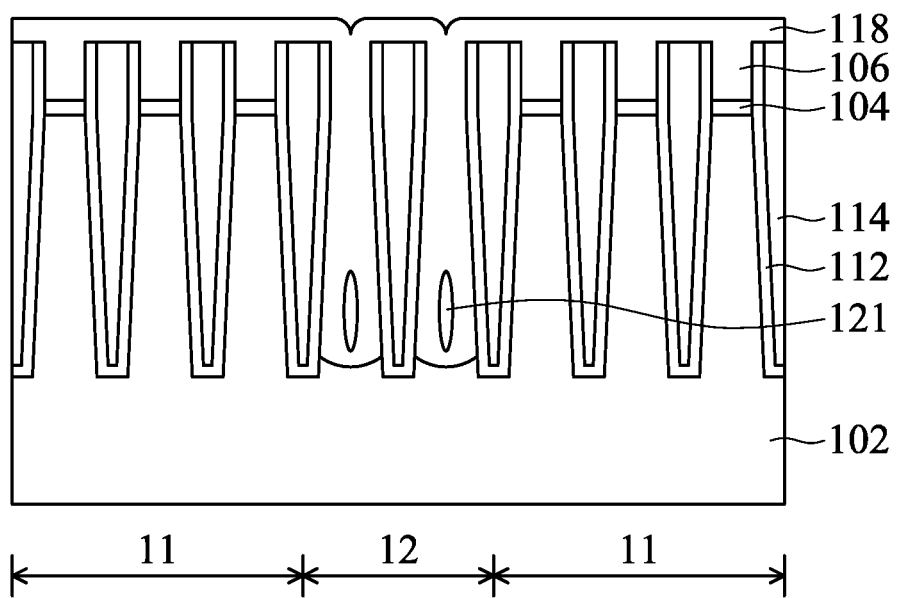

Next, as shown in FIG. 2E, a filling layer 118 is formed in the trench 117 and on the patterned mask layer 106, in accordance with some embodiments of the disclosure. The filling layer 118 and the isolation layer 114 are made of different materials. In addition, the filling layer 118 and the second fin structures 110b are made of different materials. Therefore, there is a distinguishable interface between the top surface of the second fin structures 110b and the bottom surface of the filling layer 118.

In some embodiments, the filling layer 118 is made of silicon nitride, silicon oxynitride (SiON) or a combination thereof. In some embodiments, the filling layer 118 is formed by a deposition process, such as chemical vapor deposition (CVD), physical vapor deposition (PVD), atomic layer deposition (ALD), or another applicable process.

Figure 2F:
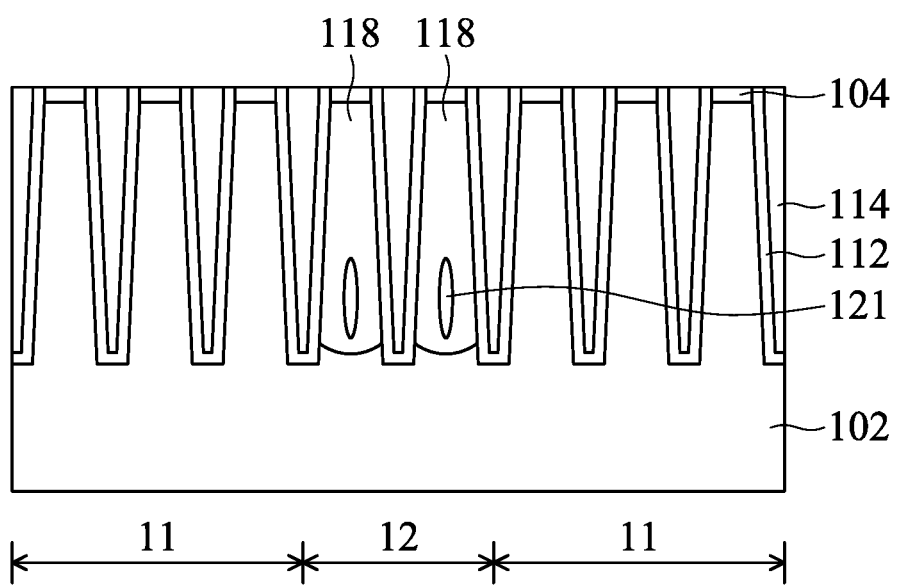

Afterwards, as shown in FIG. 2F, the filling layer 118 and the patterned mask layer 106 are thinned or planarized to expose the top surface of each of the dielectric layer 104, in accordance with some embodiments. In some embodiments, the filling layer 118 and the patterned mask layer 106 are thinned by a chemical mechanical polishing (CMP) process.

Since the trench 117 has a high aspect ratio, the trench 117 is hard to be completely filled with the filling layer 118. Therefore, a void 121 is formed in a bottom portion of the filling layer 118. The void 121 is enclosed by the filling layer 118.

Figure 2G:
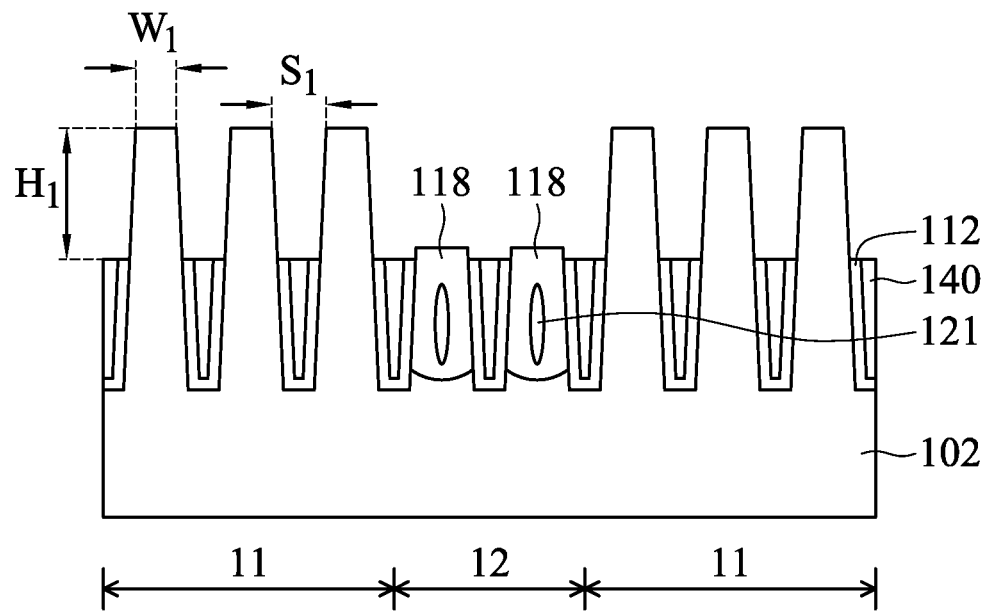

Next, as shown in FIG. 2G, the patterned dielectric layer 104 is removed, and then an upper portion of the isolation layer 114, an upper portion of the liner layer 112 and an upper portion of the filling layer 118 are simultaneously removed by an etching process, in accordance with some embodiments. As a result, an isolation structure 140 is obtained. The first fin structures 110a extend above the top surface of the isolation structure 140, but the second fin structures 110b is below the top surface of the isolation structure 140.

In some embodiments, the liner layer 112 is made of silicon nitride (SixNy), the filling layer 118 is made of silicon oxynitride (SiON), and there is a distinguishable interface between the liner layer 112 and the filling layer 118.

The etching selectivity of the filling layer 118 with respect to the isolation layer 114 is slightly high, and therefore the remaining filling layer 118 protrudes above the top surface of the isolation structure 140. In other words, the top surface of the filling layer 118 is higher than the top surface of the isolation structure 140 after the etching process.

Each of the first fin structures 110a has a width $W_1$ and a fin height $H_1$. There is a space Si between two adjacent first fin structures 110a. In some embodiments, the width $W_1$ is in a range from about 5 nm to about 10 nm. In some embodiments, the fin height $H_1$ is in a range from about 50 nm to about 60 nm. In some embodiments, the space Si is in a range from about 15 nm to about 25 nm.

Figure 2H:
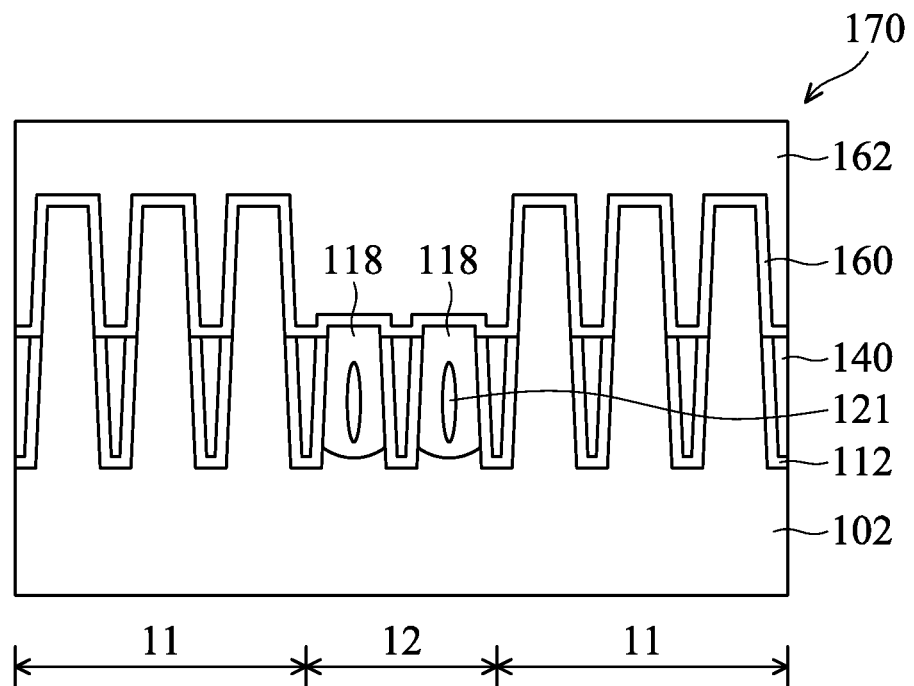
Figure 3:
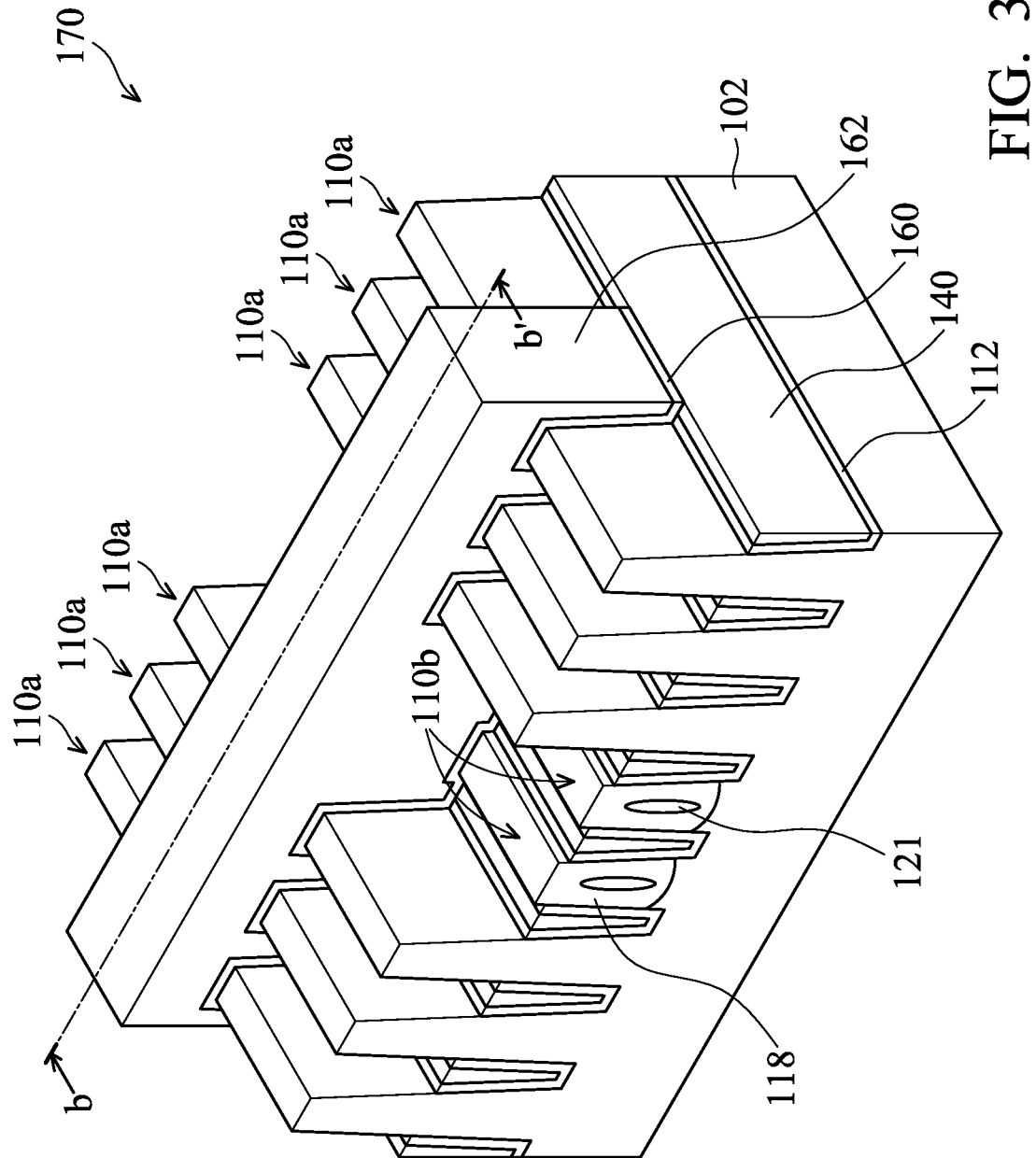
FIG. 3 shows a three-dimensional representation of the fin field effect transistor (FinFET) device structure of FIG. 2H.

Next, as shown in FIG. 2H, a dummy gate dielectric layer 160 and a dummy gate electrode layer 162 are formed on the isolation structure 140, the filling layer 118 and the liner layer 112, in accordance with some embodiments. FIG. 3 shows a three-dimensional representation of the fin field effect transistor (FinFET) device structure of FIG. 2H. FIG. 2H is cross-sectional representation taken along b-b' line of FIG. 3.

As shown in FIG. 2H and FIG. 3, the dummy gate structure 170 is formed on the middle portion of the first fin structures 110a. The middle portion of the first fin structures 110a which is surrounded or wrapped by the dummy gate structure 170 is the channel region. The dummy gate dielectric layer 160 is formed between the liner layer 112 and the dummy gate electrode layer 162.

In some embodiments, the dummy gate dielectric layer 160 is made of dielectric materials, such as silicon oxide, silicon nitride, silicon oxynitride, dielectric material with high dielectric constant (high-k), or a combination thereof. The dummy gate dielectric layer 160 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

In some embodiments, the dummy gate electrode layer 162 is made of conductive or non-conductive materials. In some embodiments, the dummy gate electrode layer 162 is made of polysilicon. The dummy gate electrode layer 162 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Afterwards, a portion of the first fin structures 110a adjacent to the dummy gate structure 170 is removed to form a recess (not shown), and a source/drain (S/D) structure is formed in the recess. In some embodiments, the source/drain structures include silicon germanium (SiGe), germanium (Ge), indium arsenide (InAs), indium gallium arsenide (InGaAs), indium antimonide (InSb), gallium arsenide (GaAs), gallium antimonide (GaSb), indium aluminum phosphide (InAlP), indium phosphide (InP), or a combination thereof.

Afterwards, the ILD structure (not shown) is formed on the dummy gate structure 170 and the source/drain structures. Next, the dummy gate structure 170 is removed to form a trench, and a gate dielectric layer and a gate electrode layer are formed in the trench. In some embodiments, the gate dielectric layer is made of high-k dielectric layer and the gate electrode layer is made of metal gate electrode layer. As a result, the high-k gate dielectric layer is over the filling layer 118, and a distinguishable interface between the high-k gate dielectric layer 118 and the filling layer since the high-k gate dielectric layer and the filling layer 118 are made of different materials. Note that the trench is not completely filled with the high-k gate dielectric layer, and a void is in the trench.

It should be noted that when the annealing process is performed on the isolation layer 114 (in FIG. 1D), the deformations of existing fin structures occur. For example, the isolation layer 114 may shrink after the annealing process, and the space between fin structures may be reduced. If a portion of the fin structures is removed before the annealing process (e.g. fin removal process is performed before the annealing process), the space between every two adjacent fin structures may be different. The different space may cause fin bending. In this embodiment, the fin removal process is performed after the annealing process, and therefore the space between every two adjacent fin structures is maintained, and the performance of the FinFET device structure is improved.

If a portion of the fin structures are removed before formation of isolation layer is called as a fin cut first process. The fin cut first process is formed by using a number of the photoresist strips with uneven space. When the underlying layers (e.g. the dielectric layer, the mask layer and the substrate) are etched by using the patterned photoresist layer as a mask, the fin structures will have different fin widths due to the loading effect. In contract to the fin cut first process, the fin cut last process is used in this disclosure. The patterned photoresist layer 108 with a number of photoresist strips with a regular space are formed first, and then the first fin structures 110a and the second fin structures 110b are formed by using the patterned photoresist layer 108 as a mask. Therefore, each of the first fin structures 110a and the second fin structures 110b has a regular fin width and fin size. Afterwards, a top portion of the second fin structures 110b are removed to form the dummy second fin structures 110b. Therefore, variation in fin width is reduced. Furthermore, the performance of the fin field effect transistor (FinFET) device structure is improved.

FIGS. 4A-4D show cross-sectional representations of forming a fin field effect transistor (FinFET) device structure, in accordance with some embodiments of the disclosure. Some processes and materials used to form the FinFET device structure in FIGS. 4A-4D are similar to, or the same as, those used to form the FinFET structure in FIGS. 2A-2H and are not repeated herein.

Figure 4A:
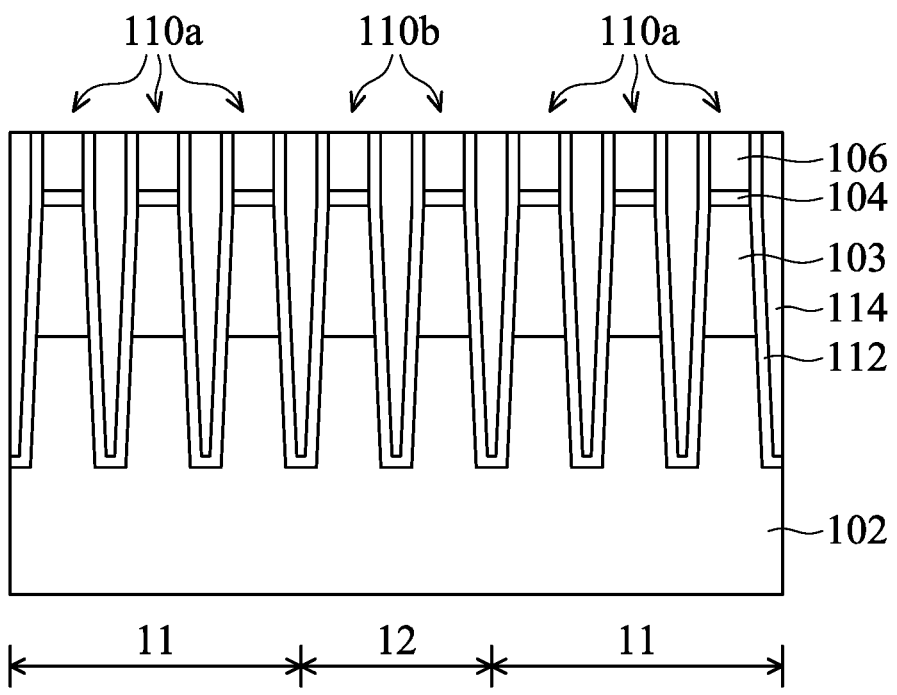
FIGS. 4A-4D show cross-sectional representations of forming a fin field effect transistor (FinFET) device structure, in accordance with some embodiments of the disclosure.

The structure of FIG. 4A is similar to the structure of FIG. 2A, the difference is that the top portions of the first fin structures 110a and the top portions of the second fin structures 110b are replaced by the material layer 103 in FIG. 4A.

As shown in FIG. 4A, each of the first fin structures 110 and each of the second fin structures 110b has a top portion and a bottom portion. The top portion is made of material layer 103.

The material layer 103 is formed over the substrate 102, and the material layer 103 and the substrate 102 are made of different materials. In some embodiments, the material layer 103 is made of silicon germanium (SiGe), and the substrate 102 is made of silicon (Si). The material layer 103 is formed by an epitaxial process. The epitaxial process may include a selective epitaxy growth (SEG) process, CVD deposition techniques (e.g., vapor-phase epitaxy (VPE) and/or ultra-high vacuum CVD (UHV-CVD)), molecular beam epitaxy, or other suitable epi processes.

It should be noted that when the material layer 103 is made of silicon germanium (SiGe), silicon germanium (SiGe) is easily oxidized to form germanium oxide (GeOx) during the subsequent annealing process. Once the germanium oxide (GeOx) is formed, it is easily removed by the etching process. Therefore, the liner layer 112 is formed on sidewalls of each of the top portion of the first fin structures 110a and the second fin structures 110b to protect the material layer 103 from being damaged by the subsequent processes. Furthermore, the profiles of the top portion of the first fin structures 110 and the second fin structures 110b may be preserved.

Figure 4B:
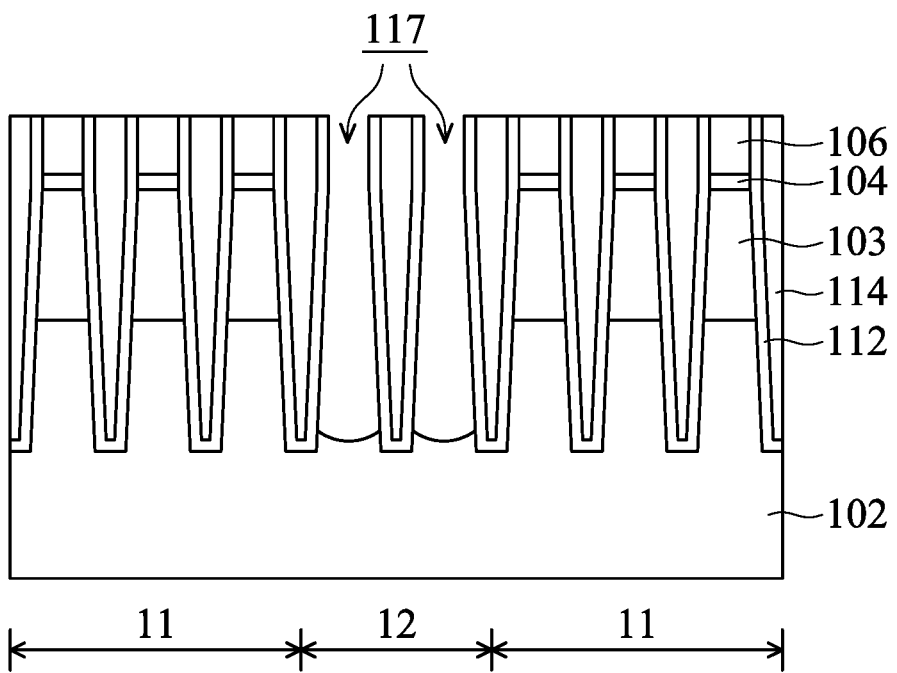

Afterwards, as shown in FIG. 4B, a portion of the patterned mask layer 106, a portion of patterned dielectric layer 104, a portion of the second fin structure 110b are removed to form the trench 117, in accordance with some embodiments of the disclosure. Although the portion of the second fin structure 110b is removed, the liner layer 112 is not removed since the liner layer 112 has a higher etching resistance. Therefore, the liner layer 112 is exposed by the trench 117. The trench 117 has a tapered width from bottom to top.

The bottom surface of the trench 117 is lower than the interface between the top portion (made of material layer 103) and the bottom portion of each of the first fin structures 110a. In other words, the top surface of each of the second fin structures 110b is lower than the interface between the top portion and the bottom portion of the first fin structures 110a.

Figure 4C:
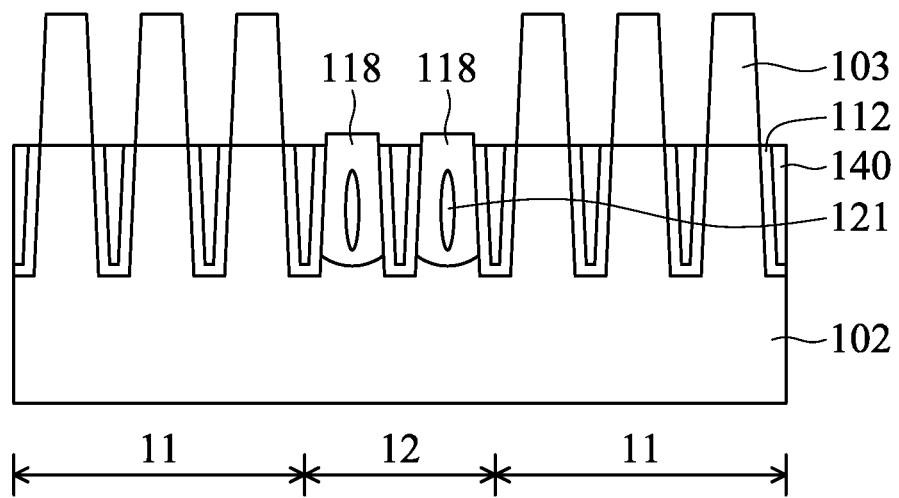

Afterwards, as shown in FIG. 4C, the trench 117 is filled with the filling layer 118, and a top portion of the filling layer 118 is removed, in accordance with some embodiments of the disclosure. In addition, the patterned mask layer 106, the patterned dielectric layer 104, and a portion of the isolation layer 114 are sequentially removed.

The top surface of the filling layer 118 is higher than the interface between the top portion and the bottom portion of each of the first fin structures 110a. Since the trench 117 is not completely filled with the filling layer 118, the void 121 is formed in the trench 117.

Figure 4D:
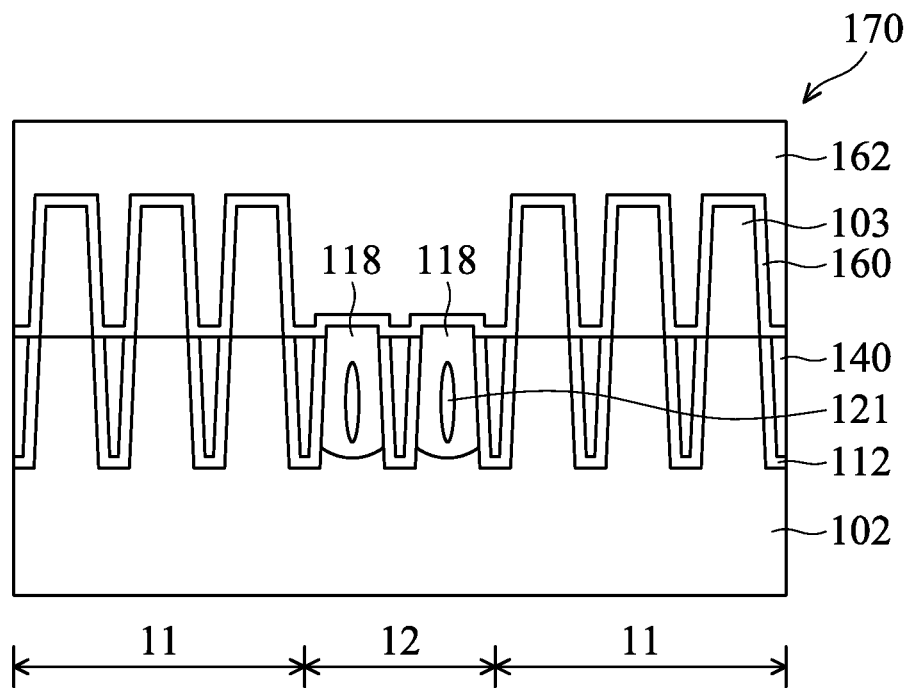

Next, as shown in FIG. 4D, the dummy gate dielectric layer 160 and the dummy gate electrode layer 162 are formed on the isolation structure 140 and the liner layer 112, in accordance with some embodiments. Afterwards, the FinFET device structure continues to form other devices.

FIGS. 5A-5D show cross-sectional representations of forming a fin field effect transistor (FinFET) device structure, in accordance with some embodiments of the disclosure. Some processes and materials used to form the FinFET device structure in FIGS. 5A-5D are similar to, or the same as, those used to form the FinFET structure in FIGS. 2A-2H and are not repeated herein.

Figure 5A:
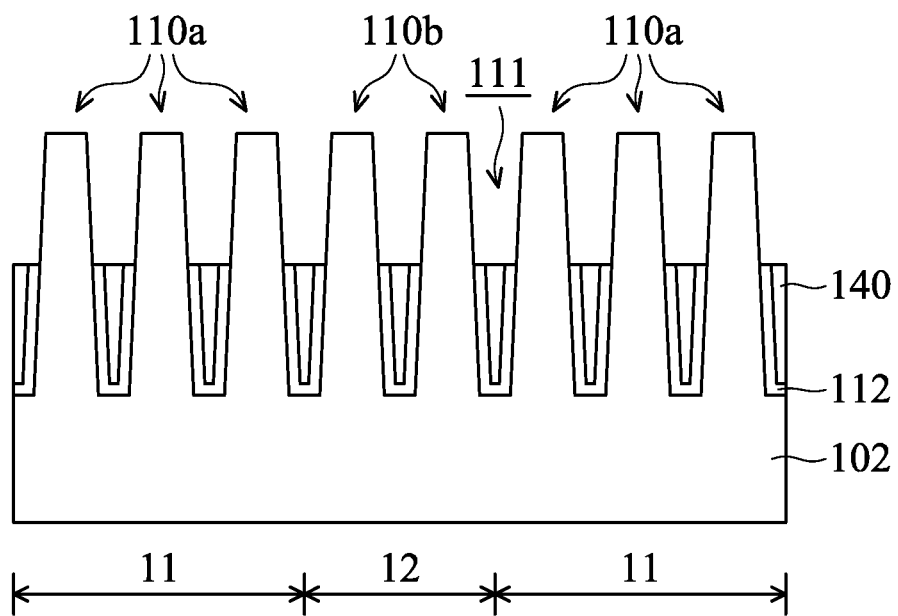
FIGS. 5A-5D show cross-sectional representations of forming a fin field effect transistor (FinFET) device structure, in accordance with some embodiments of the disclosure.

As shown in FIG. 5A, the isolation structure 140 is formed by forming an isolation layer over the first fin structures 110a, the second fin structures 110b, performing an annealing process and a removing process. The first fin structures 110a, the second fin structures 110b extend above the isolation structure 140. The liner layer 112 is formed on sidewalls of the bottom portion of the first fin structures 110a, the second fin structures 110b. A number of trenches 111 are formed between two adjacent fin structures 110a, 110b.

Figure 5B:
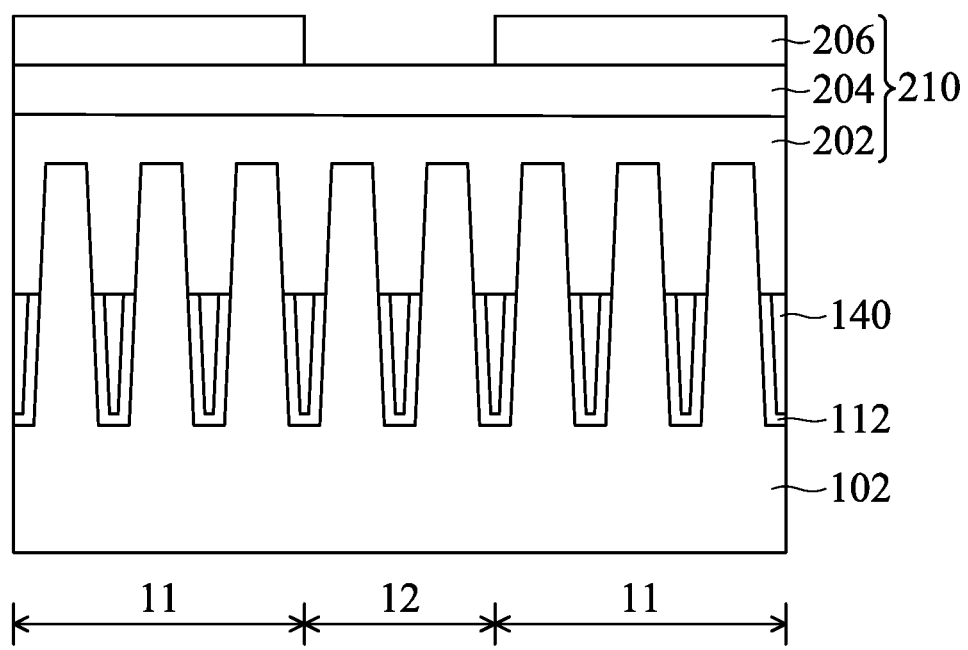

Afterwards, as shown in FIG. 5B, the photoresist layer 210 is formed in the trenches 111, and over the patterned mask layer 106 and the liner layer 112, in accordance with some embodiments of the disclosure. The photoresist layer 210 includes the bottom anti-reflective coating (BARC) layer 202, the middle layer 204 and the top layer 206. Afterwards, the top layer 206 is patterned to form a patterned top layer 206.

Figure 5C:
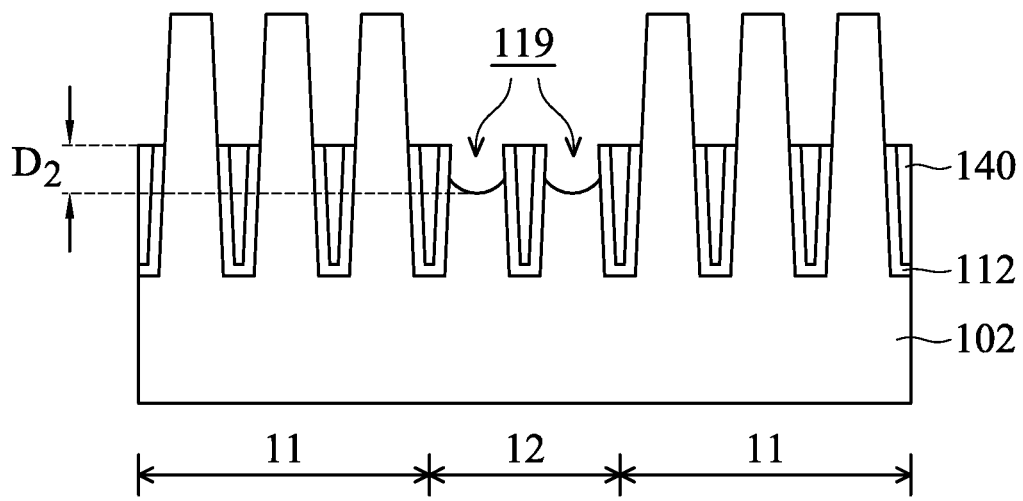

Next, as shown in FIG. 5C, the middle layer 204 and the BARC layer 202 are patterned by using the patterned top layer 206 as a mask, in accordance with some embodiments of the disclosure. Next, a portion of the second fin structures 110b is removed to form a recess 119. The recess 119 is formed on the top surface of each of the second fin structures 110b, and the recess 119 is lower than a top surface of the isolation structure 140. Since most of the second fin structures 110b is removed, the second fin structures 110b are called as dummy fin structures 110b.

The recess 119 has a concave top surface, and the concave top surface has a middle lowest point. The recess 119 has a depth $D_2$ which is measured from the top surface of the isolation structure 140 to a bottom surface of the recess 119. The lowest point of the recess 119 is lower than the top surface of the isolation structure 140. In some embodiments, the depth $D_2$ of the recess 119 is in a range from about 15 nm to about 20 nm. If the depth $D_2$ of the recess 119 is smaller than 15 nm, the S/D structure may be formed in the recess 119 to degrade the performance of the FinFET device structure. If the depth $D_2$ of the recess 119 is greater than 20 nm, it is difficult to fill the dummy gate dielectric layer 160 (formed later) into the recess 119.

Figure 5D:
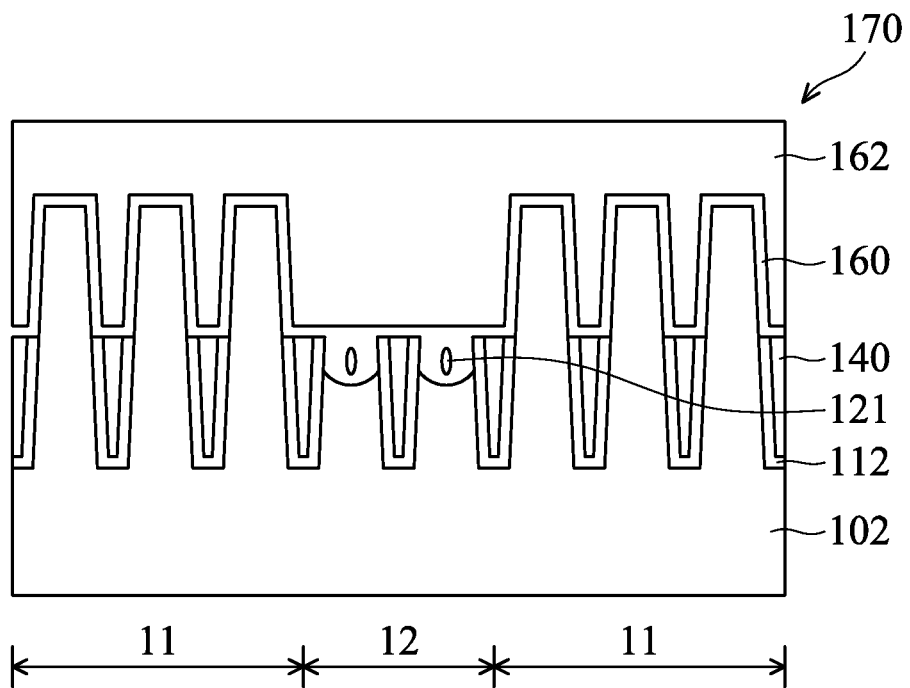

Afterwards, as shown in FIG. 5D, the dummy gate dielectric layer 160 and the dummy gate electrode layer 162 are formed in the recess 119, and on the isolation structure 140 and the liner layer 112, in accordance with some embodiments.

The dummy gate dielectric layer 160 and the isolation structure 140 are made of different materials. In some embodiments, the dummy gate dielectric layer 160 is made of silicon oxynitride, the isolation structure 140 is made of silicon oxide, and there is a distinguishable interface between the dummy gate dielectric layer 160 and the isolation structure 140.

The recess 119 is filled with the dummy gate dielectric layer 160, but it is not completely filled with the gate dielectric layer 160. Therefore, the void 121 is formed in the recess 119. The dummy gate dielectric layer 160 includes a first portion which is directly over the first fin structures 110a and a second portion which is directly over the second fin structures 110b, and the second portion is lower than the first portion.

Afterwards, the ILD structure (not shown) is formed on the dummy gate structure 170 and the source/drain structures. Next, the dummy gate structure 170 is removed to form a trench, and a high-k gate dielectric layer dielectric layer and a metal gate electrode layer are formed in the trench. As a result, the recess 119 is filled with the high-k dielectric layer, and there is a distinguishable interface between the high-k gate dielectric layer and the isolation structure 140.

In this embodiment, the first fin structures 110a and the second fin structures 110b are first formed, and then a portion of the second fin structures 110b is removed to form the dummy second fin structures 110b. Since the first fin structures 110a and the second fin structures 110b are formed with regular fin width and fin size, the first fin structures 110a still have constant fin width after the portion of the second fin structures 110b is removed. Therefore, the variation in fin width is reduced. Furthermore, the second fin structures 110b is removed after the annealing process for the isolation layer 114, and therefore the space between every two adjacent fin structures is maintained. Therefore, the performance of the fin field effect transistor (FinFET) device structure is improved.

FIGS. 6A-6D show cross-sectional representations of forming a fin field effect transistor (FinFET) device structure, in accordance with some embodiments of the disclosure. Some processes and materials used to form the FinFET device structure in FIGS. 6A-6D are similar to, or the same as, those used to form the FinFET structure in FIGS. 2A-2H and are not repeated herein.

Figure 6A:
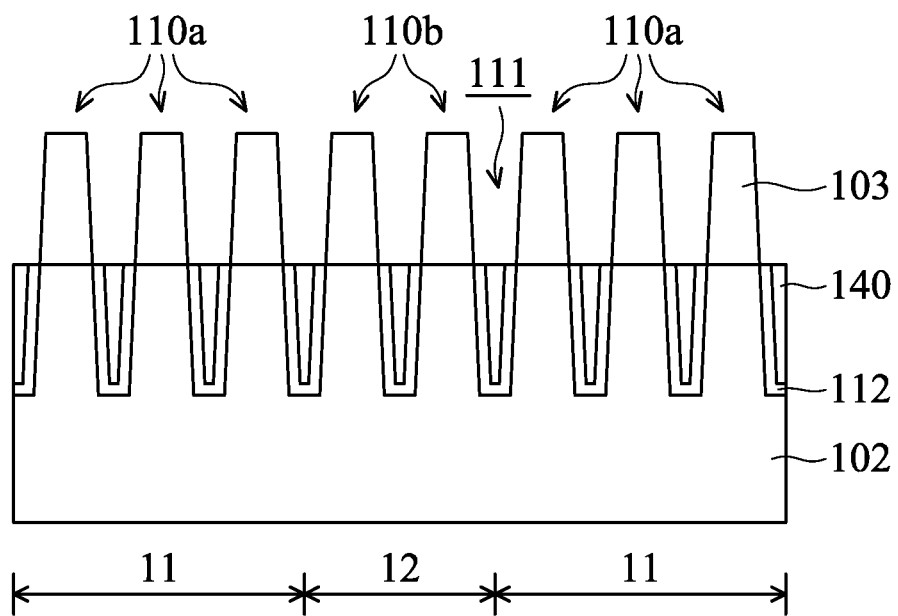
FIGS. 6A-6D show cross-sectional representations of forming a fin field effect transistor (FinFET) device structure, in accordance with some embodiments of the disclosure.

The structure of FIG. 6A is similar to the structure of FIG. 5A, the difference is that the top portions of the first fin structures 110a and the top portions of the second fin structures 110b are replaced by the material layer 103 in FIG. 6A.

As shown in FIG. 6A, each of the first fin structures 110 and each of the second fin structures 110b has a top portion and a bottom portion. The top portion is made of material layer 103. In some embodiments, the material layer 103 is made of silicon germanium (SiGe), and the substrate 102 is made of silicon (Si). A number of trenches 111 are formed between two adjacent fin structures 110a, 110b.

Figure 6B:
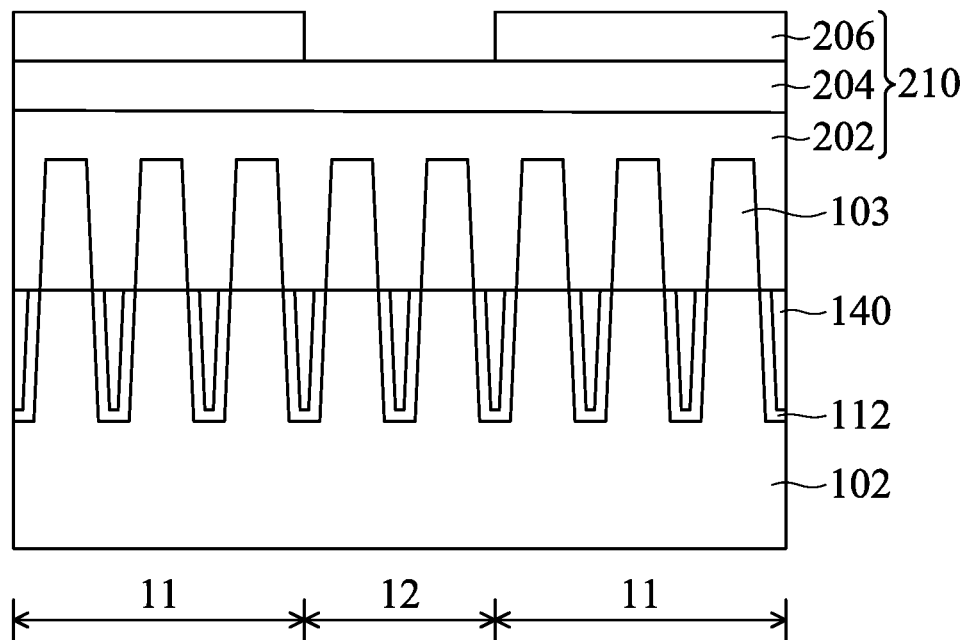

Next, as shown in FIG. 6B, the photoresist layer 210 is formed in the trenches 111, and over the patterned mask layer 106 and the liner layer 112, in accordance with some embodiments of the disclosure. The top layer 206 is patterned to form a patterned top layer 206.

Figure 6C:
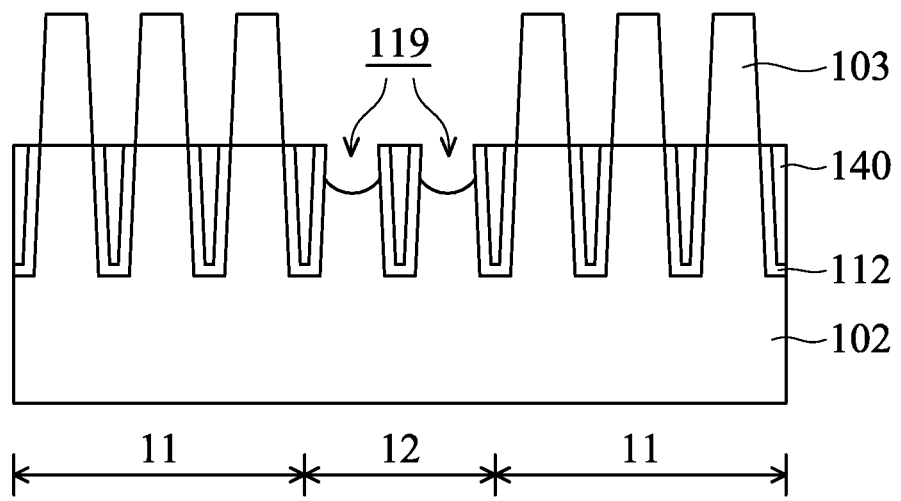

Next, as shown in FIG. 6C, the middle layer 204 and the top layer 206 are patterned by using the patterned top layer 206 as a mask, in accordance with some embodiments of the disclosure. Next, a portion of the second fin structures 110b is removed to form the recess 119. The recess 119 is formed on the top surface of each of the second fin structures 110b, and the recess 119 is lower than the top surface of the isolation structure 140. The recess 119 is lower than the interface between the top portion and the bottom portion of each of the first fin structures 110a.

Figure 6D:
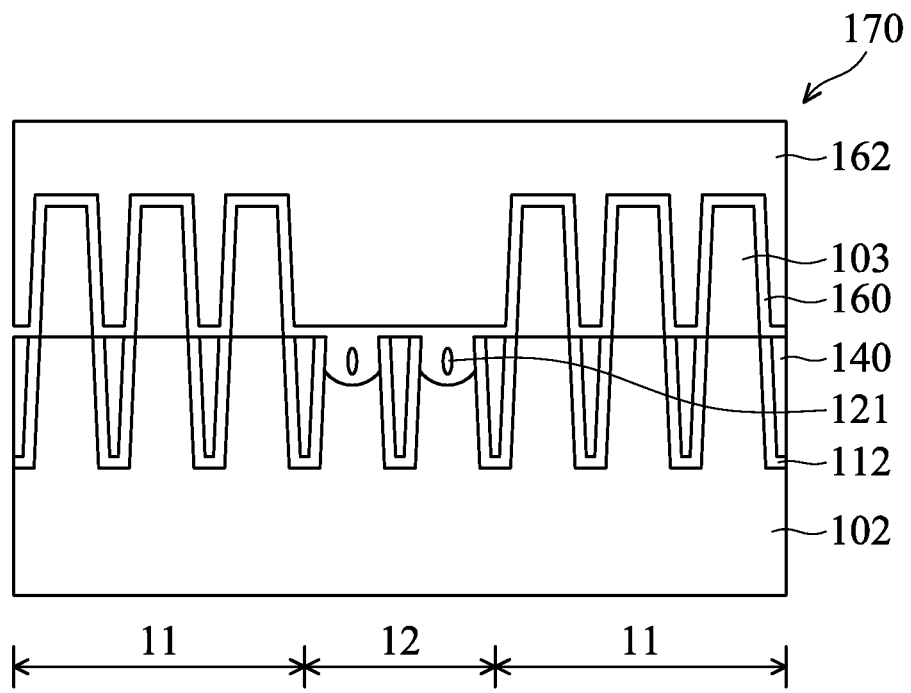

Afterwards, as shown in FIG. 6D, the dummy gate dielectric layer 160 and the dummy gate electrode layer 162 are formed in the recess 119, and on the isolation structure 140 and the liner layer 112, in accordance with some embodiments.

The first fin structures 110a and the second fin structures 110b are formed first, and then a top portion of the second fin structures 110b is removed to form the dummy fin structures 110b. A material layer (such as filling layer 118 or the dummy gate dielectric layer 160) is formed over the dummy second fin structures 110b, and the material layer and the isolation structure are made of different materials. In some embodiments, as shown in FIG. 2H, the filling layer 118 is directly formed on the dummy second fin structures 110b, and the filling layer 118 extends above the top surface of the isolation structure 140. In some other embodiments, as shown in FIG. 5D, the gate dielectric layer 160 is directly formed on the dummy second fin structures 110b.

Embodiments for forming a fin field effect transistor (FinFET) device structure are provided. A number of first fin structures and a number of second fin structures are formed, and then a portion of the second fin structures are removed by a removal process to form the dummy second fin structures. The removal process is performed after an annealing process on the isolation layer. Therefore, the space between every two adjacent fin structures is maintained. In addition, each of the first fin structures and the second fin structures has a regular fin width before the removal process. The variation in fin width is reduced. Therefore, the performance of the fin field effect transistor (FinFET) device structure is improved.

In some embodiments, a fin field effect transistor (FinFET) device structure is provided. The FinFET device structure includes an isolation structure over a substrate, and a first fin structure extended above the isolation structure. The FinFET device structure includes a second fin structure embedded in the isolation structure, and a liner layer formed on sidewalls of the first fin structures and sidewalls of the second fin structures. The FinFET device structure includes a material layer formed over the second fin structures, and the material layer and the isolation structure are made of different materials.

In some embodiments, a fin field effect transistor (Fin-FET) device structure is provided. The FinFET device structure includes an isolation structure over a substrate, and a first fin structure extended above the isolation structure. The FinFET device structure also includes a second fin structure, and a top surface of the second fin structure is lower than a top surface of the isolation structure. The FinFET device structure includes a material layer formed over the second fin structures, and the material layer has a tapered with form bottom to top.

In some embodiments, a fin field effect transistor (Fin-FET) device structure is provided. The FinFET device structure includes an isolation structure over a substrate, and a first fin structure extended above the isolation structure. The FinFET device structure also includes a second fin structure, and a top surface of the second fin structure is lower than a top surface of the isolation structure. The FinFET device structure includes a gate dielectric layer formed over the second fin structure, and a portion of the gate dielectric layer has a recessed bottom surface.

In some embodiments, a fin field effect transistor (Fin-FET) device structure is provided. The fin field effect transistor (FinFET) device structure includes an isolation structure over a substrate, and a first fin structure extended above the isolation structure. The fin field effect transistor (FinFET) device structure includes a second fin structure adjacent to the first fin structure, and a material layer formed over the fin structure. The material layer and the isolation structure are made of different materials, the material layer has a top surface with a top width and a bottom surface with a bottom width, and the bottom width is greater than the top width.

In some embodiments, a fin field effect transistor (Fin-FET) device structure is provided. The fin field effect transistor (FinFET) device structure includes a first fin structure formed over a substrate, and a second fin structure adjacent to the first fin structure. A top surface of the second fin structure is lower than a top surface of the isolation structure. The fin field effect transistor (FinFET) device structure includes a material layer formed over the second fin structure, and the top surface of the material layer is lower than a top surface of the first fin structure.

In some embodiments, a fin field effect transistor (Fin-FET) device structure is provided. The fin field effect transistor (FinFET) device structure includes an isolation structure over a substrate, and a first fin structure extended above the isolation structure. The fin field effect transistor (FinFET) device structure includes a second fin structure adjacent to the first fin structure, and a top surface of the second fin structure is lower than a top surface of the isolation structure. The fin field effect transistor (FinFET) device structure includes a material layer formed over the second fin structure, wherein a sidewall of the material layer does not extend beyond a sidewall of the second fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A fin field effect transistor (FinFET) device structure, comprising:
    an isolation structure over a substrate;
    a first fin structure extended above the isolation structure;
    a second fin structure adjacent to the first fin structure;
    a filling layer formed over the second fin structure, wherein the filling layer and the isolation structure are made of different materials, the filling layer has a top surface with a top width and a bottom surface with a bottom width, and the bottom width is greater than the top width; and
    a liner layer formed on outer sidewalls of the second fin structure, wherein the liner layer is in direct contact with a bottommost surface of the filling layer, and the second fin structure has a recessed top surface.

2. The fin field effect transistor (FinFET) device structure as claimed in claim 1, wherein a void is directly formed on the second fin structure, and the void is enclosed by the filling layer.

3. The fin field effect transistor (FinFET) device structure as claimed in claim 2, wherein the void is not in direct contact with the second fin structure.

4. The fin field effect transistor (FinFET) device structure as claimed in claim 1, further comprising:
    a gate dielectric layer formed on the filling layer, wherein a portion of the gate dielectric layer is lower than a top surface of the filling material layer.

5. The fin field effect transistor (FinFET) device structure as claimed in claim 4, wherein the gate dielectric layer is in direct contact with a portion of the filling material layer which is not cover by the liner layer.

6. The fin field effect transistor (FinFET) device structure as claimed in claim 1, wherein a portion of the filling material layer is higher than a top surface of the liner layer.

7. A fin field effect transistor (FinFET) device structure, comprising:

a first fin structure formed over a substrate;
a second fin structure adjacent to the first fin structure, wherein a top surface of the second fin structure is lower than a top surface of an isolation structure; and
a material layer formed over the second fin structure, wherein a topmost surface of the material layer is lower than a top surface of the first fin structure,
wherein the first fin structure comprises a top portion and a bottom portion, the top portion and the bottom portion made of different materials, and an interface between the top portion and the bottom portion of the first fin structure is higher than the top surface of the second fin structure.

8. The fin field effect transistor (FinFET) device structure as claimed in claim 7, further comprising:
a liner formed on sidewalls of the material layer, wherein a bottom surface of the liner is lower than a bottom surface of the material layer.

9. The fin field effect transistor (FinFET) device structure as claimed in claim 7,
wherein the isolation structure has a triangular shaped structure.

10. The fin field effect transistor (FinFET) device structure as claimed in claim 7, wherein the interface is lower than a top surface of the material layer.

11. The fin field effect transistor (FinFET) device structure as claimed in claim 7, wherein there is a void in the material layer.

12. A fin field effect transistor (FinFET) device structure, comprising:
an isolation structure over a substrate;
a first fin structure extended above the isolation structure;
a second fin structure adjacent to the first fin structure, wherein a top surface of the second fin structure is lower than a top surface of the isolation structure; and
a material layer formed over the second fin structure, wherein a sidewall of the material layer does not extend beyond a sidewall of the second fin structure.

13. The fin field effect transistor (FinFET) device structure as claimed in claim 12, further comprising:
a liner formed on the sidewalls of the second fin structure, wherein a top surface of the liner is higher than a top surface of the second fin structure.

14. The fin field effect transistor (FinFET) device structure as claimed in claim 13, wherein the liner is between the portion of the gate dielectric layer and the isolation structure.

15. The fin field effect transistor (FinFET) device structure as claimed in claim 12, wherein the first fin structure comprises a top portion and a bottom portion, the top portion and the bottom portion made of different materials, and an interface between the top portion and the bottom portion of the first fin structure is higher than the top surface of the second fin structure.

16. The fin field effect transistor (FinFET) device structure as claimed in claim 12, further comprising:
a gate dielectric layer formed on the second fin structure, wherein a portion of the gate dielectric layer is lower than the top surface of the isolation structure.

17. The fin field effect transistor (FinFET) device structure as claimed in claim 16, wherein a void is embedded in the gate dielectric layer, and the void is lower than the top surface of the isolation structure.

18. The fin field effect transistor (FinFET) device structure as claimed in claim 16, wherein the portion of the gate dielectric layer which is lower than the top surface of the isolation structure has a depth, another portion of the gate dielectric layer has a height which is directly formed on the top surface of the first fin structure, and the depth is greater than the height.

19. The fin field effect transistor (FinFET) device structure as claimed in claim 1, wherein a top surface of the filling layer is higher than a top surface of the isolation structure.

20. The fin field effect transistor (FinFET) device structure as claimed in claim 7, wherein the material layer has a top surface and a bottom surface, and a bottom width of the bottom surface is greater than a top width of the top surface.

* * * * *